(12) United States Patent
Meinders et al.

(10) Patent No.: US 8,640,332 B2
(45) Date of Patent: Feb. 4, 2014

(54) METHOD OF MANUFACTURING A STACKED FOIL SHEET DEVICE

(75) Inventors: Erwin Rinaldo Meinders, Veldhoven (NL); Gerwin Hermanus Gelinck, Valkenswaard (NL)

(73) Assignee: Nederlandse Organisatie Voor Toegepast-Natuurwetenschappelijk Onderzoek TNO, Delft (NL)

( * ) Notice: Subject to any disclaimer, the term of this patent is extended or adjusted under 35 U.S.C. 154(b) by 485 days.

(21) Appl. No.: 12/823,946

(22) Filed: Jun. 25, 2010

(65) Prior Publication Data

US 2011/0048619 A1 Mar. 3, 2011
US 2013/0306227 A9 Nov. 21, 2013

Related U.S. Application Data

(63) Continuation of application No. PCT/NL2008/050855, filed on Dec. 29, 2008.

(30) Foreign Application Priority Data

Dec. 27, 2007 (EP) .................................... 07150452

(51) Int. Cl.
*H01R 43/00* (2006.01)
(52) U.S. Cl.
USPC ............................................. 29/825; 29/846
(58) Field of Classification Search
USPC .................................................. 29/825, 846
See application file for complete search history.

(56) References Cited

U.S. PATENT DOCUMENTS

| | | | |
|---|---|---|---|
| 4,675,627 A | 6/1987 | Johnston | |
| 5,265,327 A * | 11/1993 | Faris et al. | 29/825 |
| 6,238,175 B1 * | 5/2001 | Gotz et al. | 414/795 |
| 2011/0048619 A1 * | 3/2011 | Meinders et al. | 156/184 |

FOREIGN PATENT DOCUMENTS

| | | |
|---|---|---|
| DE | 197 56 448 | 6/1999 |
| EP | 0 434 447 | 6/1991 |
| GB | 691 308 | 5/1953 |
| JP | 06 224587 | 8/1994 |
| WO | WO 2009/084958 | 7/2009 |

* cited by examiner

*Primary Examiner* — Carl Arbes
(74) *Attorney, Agent, or Firm* — Maryellen Feehery Hank; Reed Smith LLP

(57) ABSTRACT

The invention relates to a method of aligning a flexible foil sheet having a general first foil sheet length direction to form stacked foil sheet layers on a reel having a reel diameter. The method comprises providing multiple alignment markers in the foil sheet, distanced conform the reel diameter and each having an mark length direction transverse to the first foil sheet length direction, to form protrusions and corresponding recesses on opposite faces of the foil sheet; winding the foil sheet on the reel in the first foil sheet length direction of the foil sheet; and co-aligning the alignment markers to have protrusions of one mark matching with a recess of another mark, so as to block relative movement of the stacked foil sheet layers in the first foil sheet length direction. Preferably, the foil sheet layers are provided with device functionality to form a stacked foil sheet layered device.

19 Claims, 5 Drawing Sheets

METHOD OF MANUFACTURING A STACKED FOIL SHEET DEVICE

This application is a continuation of copending application PCT/NL2008/050855, filed Dec. 29, 2008, which claims the priority of application EP 07150452.6, filed Dec. 27, 2007.

RELATED APPLICATIONS

This application is the United States National Stage of International Application No. PCT/NL2008/050855, filed Dec. 29, 2008, which was published as International Publication No. WO 2009/084958, and which claims benefit of European Patent Application No. 07150452.6 filed Dec. 27, 2007. Both applications are incorporated by reference in their entirety herewith.

The invention relates to a method of manufacturing a stacked device wherein a plurality of flexible foil sheets is provided each having device functionality zones.

BACKGROUND

In the art, a desire exists to produce flexible foil sheet based complex electronic devices, in contrast to the prior art silicon based devices. In particular, using organic electronics, such as OLEDS or the like, it is made feasible to manufacture 3D electronic devices, that have a stack of electronic circuitry incorporated on several stacked flexible foil sheets. Thus, several foil sheet layers can be combined to produce a complex electronic system, wherein layers of different design are working together. For example, one can think of a sensor device having (organic) sensing circuitry provided on one foil sheet layer, and connected to an energy storage foil sheet layer stacked to the sensor layer. Additionally display functionality may be present on another layer or on a different part of one of the layer. To manufacture such devices, multiple foil sheet layers are stacked to a three-dimensional plastic electronics medium.

A main advantage of (plastic) electronics on flexible foil sheets is the large-scale, cost-efficient production and manufacturing potential. These devices are currently manufactured in batch-wise production. However, this manufacturing process is time consuming, and alignment of each of the layers needs to be done separately. The invention aims to provide a method of manufacturing a stacked device wherein the production speed of the manufacturing process is substantially improved. WO2006061361 discloses an optical data memory on cylindrical core, wherein stacked layers are provided each having an optical data memory function.

SUMMARY OF THE INVENTION

According to the invention, a method is provided of manufacturing a stacked device, comprising: providing a foil sheet having device functionality zones; aligning the device functionality zones in the foil sheet to form stacked foil sheets on a reel having a reel radius, electrically connecting at least some of the device functionality zones; and separating the stacked foil sheets from the reel to form the stacked foil sheet device. In this way, a 3D flexible foil sheet electronics medium can be made by stacking multiple foils on top of each other and high throughput roll-to-roll or roll-to-sheet production methods, like utilized in the newspaper printing business are made possible.

Other features and advantages will be apparent from the description, in conjunction with the annexed drawings, wherein.

DETAILED DESCRIPTION

Figure 1:
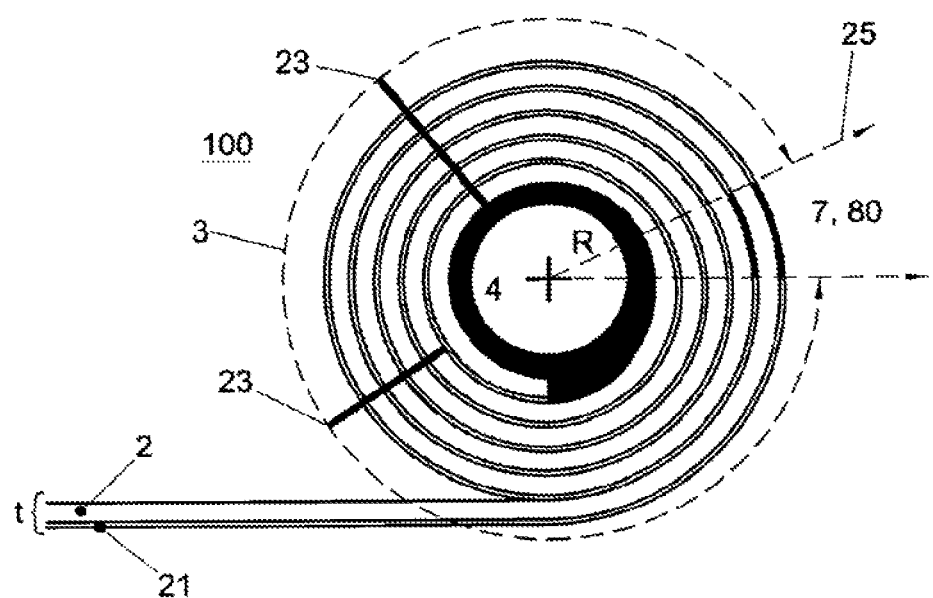
FIG. 1 shows a schematic embodiment according to the invention.

FIG. 1 schematically shows a proposed manufacturing process of a stacked device 100. In particular, according to this embodiment, a three-dimensional wound medium is provided wherein device functionality zones 3, also called information zones are aligned. Thus, by aligning the information zones in a winding process a stacked device 100 can be produced. In this way, multiple layers are stacked via controlled winding of a foil sheet 2. A lamination layer 21 is provided for laminating the stacked layers to each other, for example, by providing a glue. After winding, the device 100 can be cut off from the reel 4 along cut 25. Where in the application the term reel is used, this conforms to any 3D medium that can be used to wind the foil sheet 2. Accordingly, a method is proposed, in which a smart way of foil stacking is provided. The method allows for stacking multiple layers to a three-dimensional device 100 and facilitates the via-drilling tremendously. Vias 23 can be formed during, or after complete winding by mechanical drilling, laser drilling or laser conversion of the stacked foil sheet layers 20 on the reel 4. Accordingly, the proposed type of alignment can facilitate the interconnect drilling and interconnects along a radial direction of the reel 4 can be made by single via drilling through the multiple layers.

A foil sheet 2 may comprise one or more supporting flexible carriers with a functional stack of layers provided thereon and possibly a protection layer. The functional stack typically comprises several different films or layers. It is explicitly mentioned that the definition of layer or foil sheet is not limited to the described embodiments.

The anticipated types of devices, in particular, electronic circuitry on large flexible foil sheets 20, can be used in a variety of applications, such as flexible displays, rollable displays, large sensor arrays, flexible lighting tiles and signage devices, solar cells on foils, batteries on foils, etc. One advantage of these products is the flexibility of the considered foil sheets 20, in particular, if foil sheets 20 are based on organic flexible foil carriers, such as PEN or PET materials. In that case, the foil sheets 20 can be reversibly deformed, such that they are used in, for example, a rollable display application or in products with specific shapes, for example, a curved display on a dashboard.

A further advantage of these devices is the limited thickness of the anticipated flexible foil sheets 20, such that several foil sheets 20 can be stacked in a 3-dimensional device 100. Hundreds of foil sheets 20 can be easily stacked. Examples of multi-foil approaches are the energy foil (battery foils are attached to a photovoltaic foil), a sensor foil (foil with photo-detectors, diodes and power foils), and a storage foil (with hundreds of attached foils), etc. To stack two functional foils, interconnects or micro-vias 23 between the circuitry can be provided, for instance by laser drilling and subsequent via filling is common practice for making such micro-vias 23 but require careful alignment. Careful alignment is also required in the proposed device 100, but the self-alignment function of the alignment markers 6 facilitates the via-drilling process.

Typically, the foil sheet 2 comprises device functionality zones 3, also called information zones. In these zones electronic circuitry is provided, for example, via layer deposition and patterning (lithography, direct laser writing, etc.). The deposition and patterning of the circuitry can be done before or after the creation of the alignment markers 6.

Typically, the foil sheet 2 may also comprise deformation zones 80, in which deformation areas are present, and alignment marker zones, in which the alignment markers 6 (see FIG. 3) are present.

In addition, in the device functionality zone 3, layout contacts, or interconnects can be provided, to provide electronic contact between subsequent stacked layers. Accordingly, for a layer N in a stack of layers, layers N−1 and N+1 can be addressed.

In particular, a method of manufacturing a stacked device 100 is provided, comprising: providing a foil sheet 2 having device functionality zones 3; aligning the device functionality zones 3 in the flexible foil sheets 20 to form stacked foil sheets 20 on a reel 4 having a reel radius, electrically interconnecting at least some of the stacked device functionality zones 3; and separating the stacked foil sheets 20 from the reel 4 to form the stacked foil sheet layered device 100. Although the method can be applied to produce a single device 100 to be cut from a reel 4, also multiple stacks of stacked devices can be cut from a single reel 4. For example, along a reel radius direction, a plurality of devices can be provided. Also, several stacks of devices may be produced, for instance by separating the interfacing layers of adjacent devices from each other along a radius of the wound reel 4.

The three-dimensional medium can be diced in pieces after via drilling and processing to reveal functional 3D devices. The deformation and alignment zones can be purposely left out of the 3D devices. Possible applications: batteries, memories, sensor arrays, etc. The three-dimensional electrode scheme enables, for instance, parallel processing.

Figure 2:
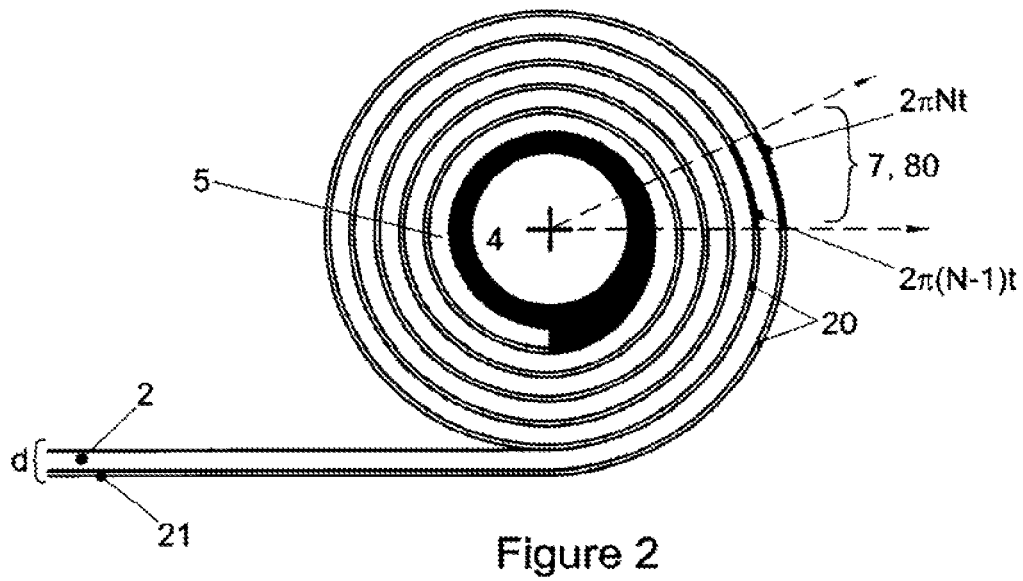
FIG. 2 shows a schematic illustration of a winding arrangement according to an aspect of the invention.

FIG. 2 shows a typical example of a wound 3-dimensional medium. It shows that the functionality zones 3 (see FIG. 1) are distanced as a function of reel radius and foil-sheet thickness. Accordingly, electronic interaction between the foil sheets 20 (layers) can be provided in a reel production process. Alignment of the stacked foil sheet layers is enhanced by providing alignment markers 6 (see FIG. 3), to be used to align the different windings 5 with respect to each other. Here, it is contemplated that the circumferential mismatch is constant for each winding: $2\pi t$, with t the thickness of the foil sheet 2. After N windings (foil sheet layer nr N), the total circumferential mismatch is $2\pi(N-1)t$.

Figure 3:
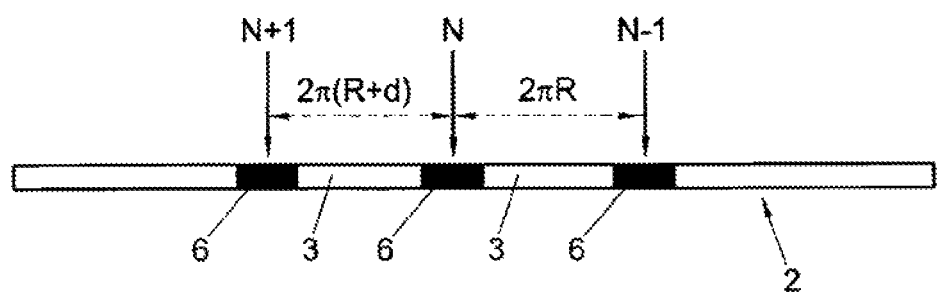
FIG. 3 shows a detailed view of the winding arrangement of FIG. 2.

FIG. 3 shows an illustrative location of alignment markers 6 for 3D alignment of wound layers. Although typically, a single alignment marker is provided per winding 5, this can be varied in principally, for example, multiple alignment markers 6 can be provided per winding 5 (see FIG. 2), or an alignment marker can be provided per predefined number of windings 5.

It is contemplated that the alignment markers 6 will influence the device functionality zone 3, and therefore, in principle, the markers 6 are preferably separated from the device functionality zone 3.

Typically, mismatch due to foil sheet thickness also may occur to the information zone. For example, if the thickness of the foil is 25 micron, the mismatch is $50\pi$ micron. Several possibilities exist to compensate the mismatch:

Divide information zone is M parts, synchronize parts such that the mismatch is only 2 pd/M is about 1 micron in case of 25 micron thick films and 100 parts (M=100).

The contact pads for contacting the vias 23 (see FIG. 1) are designed such that they can compensate the mismatch.

The alignment markers 6 and the deformation markers 8 are located in the so-called alignment marker zone 7 and deformation marker zone 80 (see FIGS. 1 and 2). By deforming the deformation zone 8, an information zone 4 may remain having the same circumferential length such that the alignment of each winding (layer) is ensured. Here, it is contemplated, that preferably, the alignment markers 6 are provided in a single marker zone 7. Accordingly, preferably, the $n^{th}$ functionality zone 3 distance $d_n$ counted from a first winding 5, satisfies $1*d_n=2*p*m*(R+n*t)$ for arbitrary integers 1 and m; and for a foil sheet thickness t and reel radius R.

Figure 4:
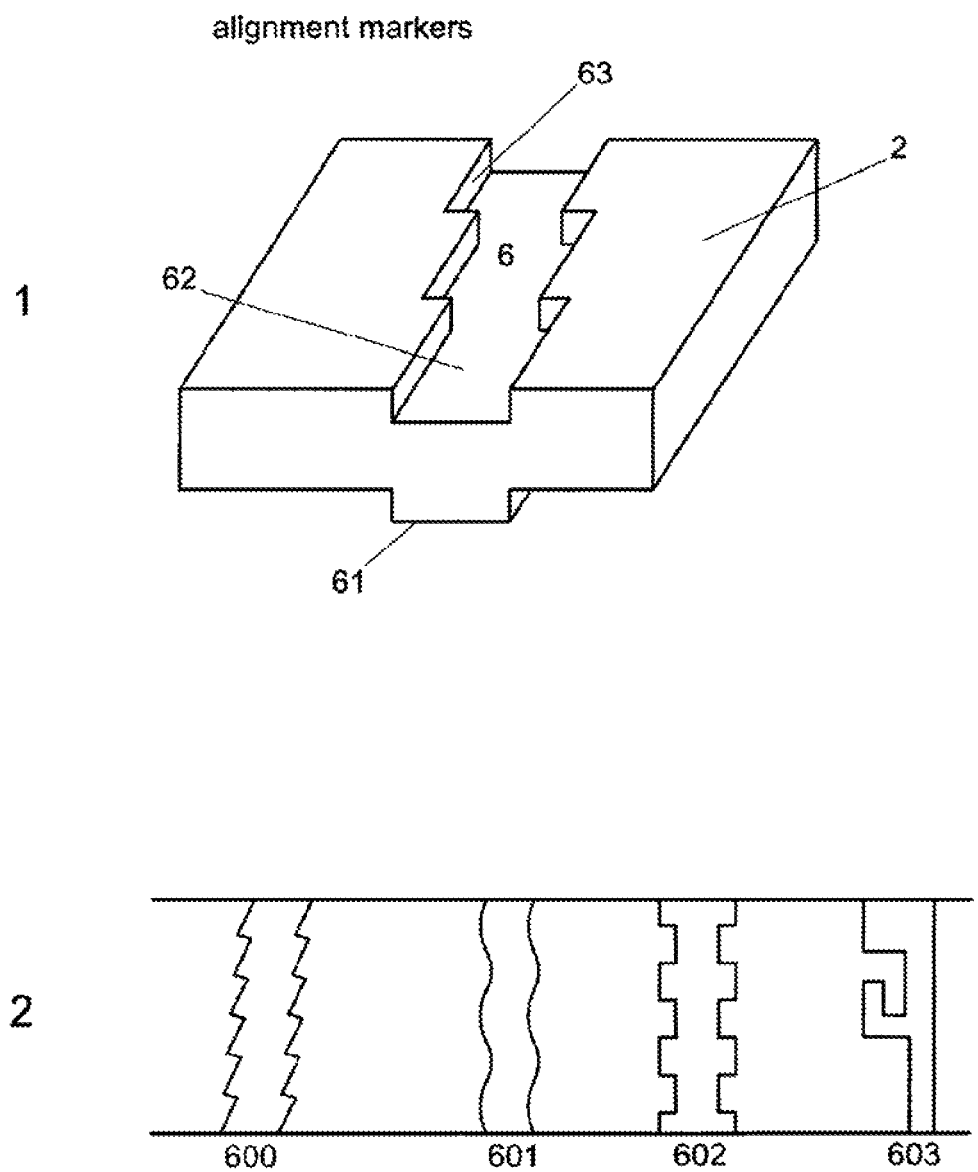
FIG. 4 shows a plurality of alignment markers according to another aspect of the invention.

FIG. 4 shows a preferred embodiment of the alignment markers 6. Although, in principle, these markers may be visual marks or otherwise detectable marks, preferably, the markers 6 are preferably arranged in marker zones, wherein embossed markers 6 are provided on the top and bottom of the foil sheet 2. The markers 6 on one face side are 'cutaways' or recesses 62; the markers 6 of the other face side are protrusions 61. A typical shape of an embossed marker 6 is given in FIG. 4A. FIG. 4B gives top views of possible other embodiments of the two-dimensional alignment marker. The shape of the marker 6 can also represent a unique code (kind of watermarking of encoding feature).

In this way, preferably, for a flexible foil sheet 2 of an elongated form having a general first foil sheet length direction, the method comprises providing multiple alignment markers 6 in the foil sheet 2, distanced conform the reel radius and each having an mark length direction transverse to the first foil sheet length direction, to form protrusions 61 and corresponding recesses; winding the foil sheet 2 on the reel 4 (see FIGS. 1 and 2) in the first foil sheet length direction of the foil sheet 2; and co-aligning the alignment markers 6 to have protrusions 61 of one mark matching with a recess of another mark, so as to align the stacked foil sheet layers 20 (see FIG. 2) in the first foil sheet length direction. Although typically, alignment markers 6 may have protrusions 61 and recesses formed on opposing faces of a foil sheet 2, this can be varied in principle, by having other connection schemes, for instance, by folding a single sheet 2 prior to winding the sheet 2 to a reel 4. Also, by having multiple sheets wound on a reel 4 in a stacked configuration, protrusions 61 of one sheet 2 may correspond to recesses of another sheet 2 in the stack; prior to winding. In such schemes, a single foil sheet 2 may comprise protrusions 61 or recesses or a combination thereof on each opposite face of the sheet 2.

In a combined stack of foil sheets 20, typically there will be protrusions 61 provided on one face of the stack, and recesses on the other face of the stack, to conform to each other when wound on the reel 4.

Preferably, for providing a single marker zone 7 (see FIGS. 1 and 2), said one and said another matching alignment markers 6 are adjacent to form a single marker zone 7 along the reel circumference. To compensate for the foil sheet thickness, preferably, the alignment markers 6 are distanced as a function of reel radius and foil sheet thickness. For providing a form locking function, the protrusions 61 and corresponding recesses are preferably provided with faces 63 aligned with the foil sheet normal direction.

Although in principle, the alignment markers 6 may be formed to provide relative movement along the alignment marker length direction, preferably, to block such movement, they are provided with an interlocking form to block relative movement of the stacked foil sheets 20 in a direction transverse to the first foil sheet length direction. An example of such a form is given in FIG. 4. In addition, to prevent lateral shifting of the winding foil sheet, the alignment markers 6 may be formed to have a second alignment marker length direction aligned with the first foil sheet length direction, so as to block relative movement of the stacked foil sheet layers transverse to the first length direction.

Figure 5:
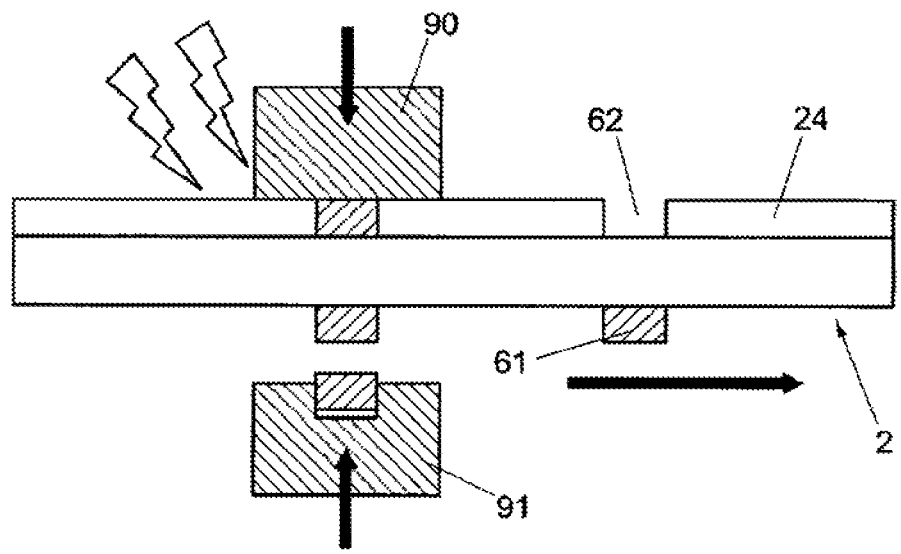
FIG. 5 shows one manufacturing embodiment to provide the alignment markers depicted in FIG. 4.
Figure 6:
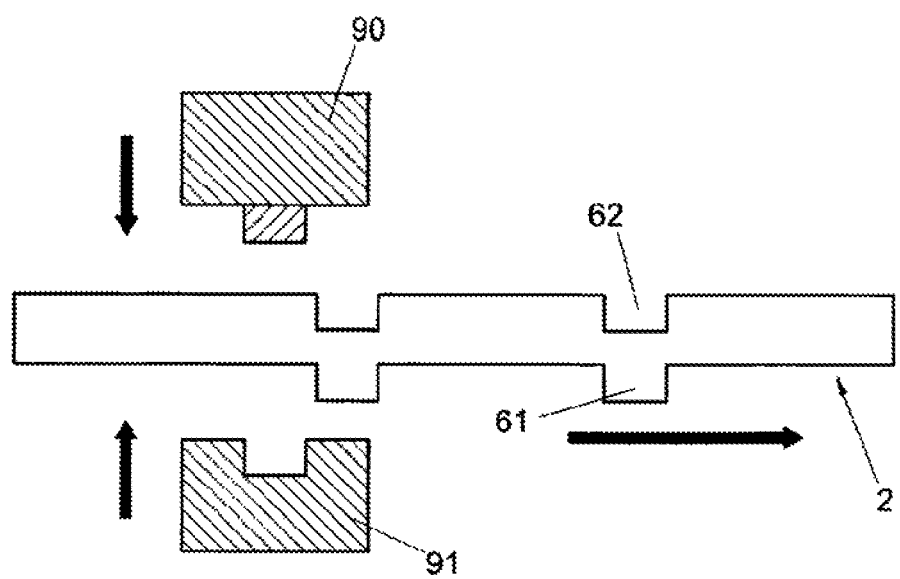
FIG. 6 shows another manufacturing embodiment to provide the alignment markers of FIG. 4.

FIG. 5 and FIG. 6 show examples of replication of the embossed alignment markers 6 (see FIG. 3) in the foil. Typically, according to the embodiment of FIG. 5, the alignment markers 6 may provided by hot embossing through drums 90, 91 foil sheet 2 or, according to the embodiment of FIG. 6, by shaping a curable layer provided on the foil sheet 2. In the latter method typically, a thin curable layer 24 is applied on top of the foil 2 via, for instance, slot die coating or gravure printing. The top markers (in this example, recesses) are present in the drums 90 as protrusions 61 and replicated in the foil sheet 2 as recesses 62 during the rolling process. The deposited layer 24 may be instantaneously cured via UV or heat. Alternatively, the markers 6 can be made via laser milling or by some other prefabrication method so that markers are already present in the foil sheet 2 before processing the foil sheet 2. In addition, the bottom markers (in this example, protrusions 61) are also present in the drum 91 (as cutaways) and are replicated in the foil as protrusions 61 via UV curing or hot embossing. The top and bottom drums are synchronized such that the relative position between the top and bottom markers is fixed. Alternatively, the markers 6 may be made via punching (plastic deformation).

Figure 7:
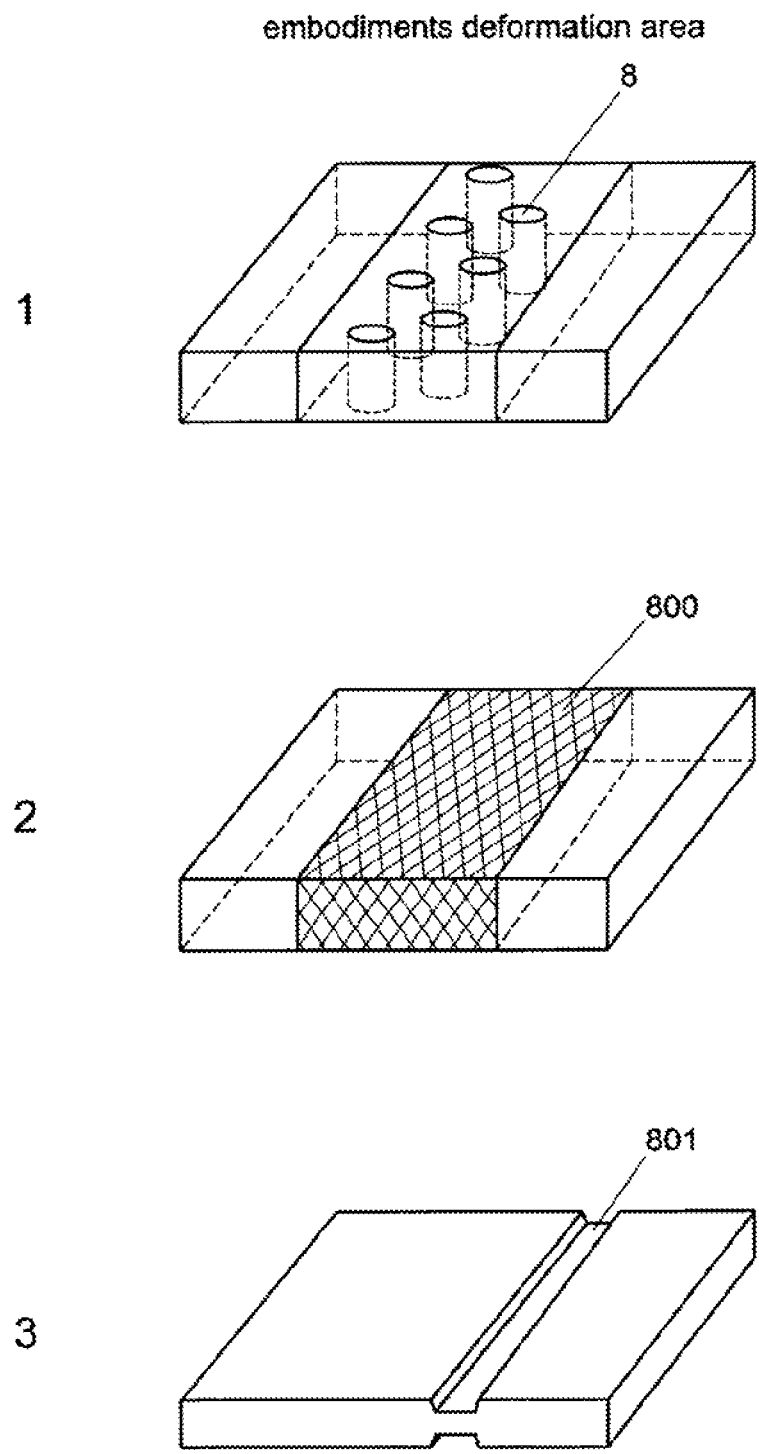
FIG. 7 shows a plurality of weakenings according to yet another aspect of the invention.

FIG. 7 shows typical examples of deformation zones 8, 800, 801 to compensate for misalignment. The deformation zones typically comprise weakenings, such as perforated areas 8, or areas having reduced thickness 801 or otherwise treated area 800 to provide a weakened zone. For example, deformation zones typically contain perforations or holes made via laser drilling, laser milling, hot embossing, mechanical punching, or the deformation zones may have a reduced thickness. Alternatively, the deformation zones 8 may have a reduced tensile strength (lower Young's modulus via UV exposure, CO2 plasma treatment, etc.).

The deformation areas 8 can thus be used to compensate for the possible mismatches in the length between subsequent alignment markers 6 (see FIG. 3). A three-dimensional perfectly aligned 3-dimensional device 100 (see FIG. 1) results.

Although the weakenings 8 can be dispensed with if the information zone 3 is distanced to compensate for foil sheet thickness, typically, while keeping the distance constant for each winding 5 (see FIG. 2), preferably, a plurality of weakenings 8 is provided in the foil sheet 2 for alignment purposes, to conform with a foil sheet thickness. Although the weakening 8 can typically be applied per each winding 5, also multiple weakenings can be provided per winding 5, or a weakening can be provided for a number of windings 5. Preferably, the weakenings are distanced to correspond to a single weakening zone along the reel circumference. Also, preferably the weakening zone is coinciding with an mark zone.

The foil is provided with deformation zones 8 to compensate for possible mismatches in the distances between the two-dimensional alignment markers 6.

Although the invention has been described using specific embodiments, the invention is not limited to these and can be used in other areas. Typically, while the invention has been shown in connection with the manufacturing of a stacked electronics device 100, typically, other embodiments can take advantage of the alignment described hereabove. Thus, the embodiments are used for explanatory purposes, where the scope of the invention is to be defined by the annexed claims.

Furthermore, although the embodiments show a single foil sheet 2 (see FIGS. 1, 2 and 3) that is wound around a reel 4 (see FIGS. 1 and 2), in practice, as indicated, the foil sheet 2 may be a of composite nature, possibly comprising multiple carriers each with stacked additional layers, which may or may not be interconnected in advance. Typically, additional layers may be provided by glue or another connection process such as laser moulding etc. Also, multiple foil sheets 20 (see FIG. 2) may be fed into a winding process, wherein alignment between the multiple foil sheets 20 is provided by the hereabove described alignment markers 6. In this way a stacked series of multiple foil sheets can be laminated. For instance, a battery foil and photovoltaic foil may be produced separately, provided by alignment markers 6 and deformation areas and stacked together via the proposed method. In that case, the alignment markers 6 on top and bottom may have the same polarity as well.

Accordingly, a flexible foil sheet 2 can be aligned on a reel 4 having a reel radius, the foil sheet 2 having a general first foil sheet length direction, by providing multiple alignment markers 6 (see FIG. 3) in the foil sheet 2 (see FIGS. 1, 2 and 3), distanced conform the reel radius and each having an alignment marker length direction transverse to the first foil sheet length direction, to form protrusions 61 (see FIGS. 4 and 5) and corresponding recesses on opposite faces of the foil sheet 2; winding the foil sheet 2 on the reel 4 (see FIGS. 1 and 2) in the first foil sheet length direction of the foil sheet 2; and co-aligning the alignment markers 6 to have protrusions of one mark matching with a recess of another mark, so as to align the stacked foil sheet layers 20 (see FIG. 2) in the first foil sheet length direction. Furthermore, although in the embodiments, the stacking of the device 100 (see FIG. 1) is provided by a single foil sheet winding 5 (see FIG. 2), typically, foil sheets 20 may be folded in advance according to a predetermined manner, for instance, to provide folded information zones. By folding foil sheets 20, alignment markers 6 may be placed in an alternating manner, and the circumferential mismatch due folding in the bending areas may be carefully considered. Where the description mentions alignment markers 6 it should be noted that any shaping method to provide these markers 6 is deemed to be included by the scope of the invention. Furthermore, while the embodiments do not explicitly show the separation step of the method, it is considered that each separation, be it cutting tearing, slicing or otherwise separating the device 100 from the reel 4 is deemed to be included by the scope of the invention.

The invention claimed is:
1. A method of manufacturing a stacked flexible foil based electronic device comprising:
providing a foil sheet having device functionality zones wherein the device functionality zones have electric circuits,
aligning the device functionality zones in the foil sheet to form stacked foil sheets on a reel having a reel radius wherein the aligning comprises stacking the device functionality zones, electrically connecting at least some of the stacked device functionality zones; and
separating the stacked foil sheets from the reel to form the stacked flexible foil based electronic device.
2. The method according to claim 1, wherein multiple stacks of the devices are cut from a single reel.

3. The method according to claim 1, wherein multiple devices are stacked on the reel.

4. The method according to claim 1, wherein the functionality zones are distanced along the foil sheet as a function of reel radius and foil sheet thickness.

5. The method according to claim 1, wherein the $n^{th}$ functionality zone distance $d_n$ counted from a first winding, satisfies $1*d_n=2*\pi*m*(R+n*t)$ for arbitrary integers 1 and m; and for a foil sheet thickness t and reel radius R.

6. The method according to claim 1, wherein the foil sheet has a general first foil sheet length direction, further comprising:
   providing multiple alignment markers in the foil sheet, distanced conform the reel radius and each having an alignment marker length direction transverse to the first foil sheet length direction, said alignment markers formed by protrusions and corresponding recesses on the foil sheet;
   winding the foil sheet on the reel in the first foil sheet length direction of the foil sheet; and
   co-aligning the alignment markers to have protrusions of one alignment marker matching with a recess of another alignment marker, so as to align the stacked foil sheets in the first foil sheet length direction.

7. The method according to claim 6, wherein each said one and said another matching alignment markers are adjacent to form a single alignment marker zone along the reel circumference.

8. The method according to claim 6, wherein the alignment markers are distanced as a function of reel radius and foil sheet thickness.

9. The method according to claim 6, wherein the protrusions and corresponding recesses are provided with faces aligned with the foil sheet normal direction.

10. The method according to claim 1, wherein a plurality of weakenings are provided in the foil sheet for alignment purposes, to conform with a foil sheet thickness.

11. The method according to claim 10, wherein the weakenings are distanced to correspond to a single weakening zone along the reel circumference.

12. The method according to claim 11, wherein the weakening zone is coinciding with an alignment marker zone along the reel circumference.

13. The method according to claim 6, wherein the alignment markers are formed to have an interlocking form to block relative movement of the stacked foil sheets in a direction transverse to the first foil sheet length direction.

14. The method according to claim 6, wherein the alignment markers are formed to have a second alignment marker length direction aligned with the first foil sheet length direction, so as to block relative movement of the stacked foil sheets transverse to the first length direction.

15. The method according to claim 1, wherein the foil sheet comprises one or more foil layers.

16. The method according to claim 1, wherein the stacked foil sheets are electrically connected by one or more vias.

17. The method according to claim 16, wherein the vias are formed by drilling, lasering or laser conversion the stacked foil sheets on the reel.

18. The method according to claim 1, wherein the alignment markers are provided by hot embossing the foil sheet or by shaping a curable layer provided on the foil sheet.

19. A method of aligning a flexible foil based electronic device on a reel having a reel radius, the device having a general first device length direction, the method comprising:
   providing multiple alignment markers in the device, distanced to conform to the reel radius and each having an alignment marker length direction transverse to the first device length direction, said alignment markers formed by protrusions and corresponding recesses;
   winding the device on the reel in the first device length direction of the device; and
   co-aligning the alignment markers to have a protrusion of one alignment marker matching with a recess of another alignment marker, so as to align the stacked devices in the first device length direction.

* * * * *